United States Patent [19]

Kajita et al.

[11] Patent Number: 5,413,896
[45] Date of Patent: * May 9, 1995

[54] I-RAY SENSITIVE POSITIVE RESIST COMPOSITION

[75] Inventors: Toru Kajita; Toshiyuki Ota; Yoshiji Yumoto; Takao Miura, all of Yokkaichi, Japan

[73] Assignee: Japan Synthetic Rubber Co., Ltd., Tokyo, Japan

[*] Notice: The portion of the term of this patent subsequent to May 28, 2008 has been disclaimed.

[21] Appl. No.: 821,806

[22] Filed: Jan. 17, 1992

[30] Foreign Application Priority Data

Jan. 24, 1991 [JP] Japan .................. 3-022603
Jan. 24, 1991 [JP] Japan .................. 3-022604

[51] Int. Cl.⁶ .................. G03F 7/023; G03F 7/30
[52] U.S. Cl. .................. 430/192; 430/165; 430/191; 430/193
[58] Field of Search .................. 430/192, 193, 165, 326

[56] References Cited

U.S. PATENT DOCUMENTS

| | | | |
|---|---|---|---|
| 4,719,167 | 1/1988 | Miura et al. | 430/192 |
| 4,738,915 | 4/1988 | Komine | 430/192 |
| 4,988,601 | 1/1991 | Ushirogouchi et al. | 430/193 |
| 5,019,479 | 5/1991 | Oka et al. | 430/192 |
| 5,087,548 | 2/1992 | Hosaka et al. | 430/192 |
| 5,108,870 | 4/1992 | Shalom | 430/165 |
| 5,110,706 | 5/1992 | Yumoto et al. | 430/193 |
| 5,112,719 | 5/1992 | Yamada et al. | 430/190 |
| 5,238,775 | 8/1993 | Kajita et al. | 430/192 |
| 5,324,620 | 6/1994 | Ebersole | 430/192 |

FOREIGN PATENT DOCUMENTS

0358871 3/1990 European Pat. Off.
0365318 4/1990 European Pat. Off.

OTHER PUBLICATIONS

Chemical Abstracts, 165539y, vol. 107, No. 18, Nov. 2, 1987, & Jpn. Kokai Tokkyo Koho JP 62 89,040, Apr. 23, 1987, 4 pages, K. Miura, et al., "Positive-Working Photoresists".
Chemical Abstracts, 99528d, vol. 104, No. 12, Mar. 24, 1986, & Jpn. Kokai Tokkyo Koho JP 60, 164, 740, Aug. 27, 1985, 8 pages, Y. Hosaka, et al., "Positive-Working Photoresist Compositions".
Chemical Abstracts, 144998u, vol. 110, No. 16, Apr. 17, 1989, & Jpn. Kokai Tokkyo Koho JP 63,234249, Sep. 29, 1988, 5 pages, M. Yajima, et al., "Positive-Working Photoresist Compositions".
Chemical Abstracts, 218119q, vol. 114, No. 22, Jun. 3, 1991, & Jpn. Kokai Tokkyo Koho JP 02,296,245, Dec. 6, 1990, 8 pages, Y. To, et al., "Photosensitive Composition Containing Hydroxyazobenzene Carboxylic Acid for Photoresists".

*Primary Examiner*—Charles L. Bowers, Jr.
*Assistant Examiner*—John S. Chu
*Attorney, Agent, or Firm*—Oblon, Spivak, McClelland, Maier, & Neustadt

[57] ABSTRACT

An i-ray sensitive positive resist composition: which (A) comprises an alkali-soluble novolak resin obtained by subjecting (a) a phenolic mixture of B to 95 mol % of 2,3-xylenol with 95 to 5 mol % of a phenol selected from mono-, di- and tri-methyl phenols other than 2,3-xylenol or (b) a phenolic mixture of 5 to 50 mol % of 8,4-xylenol with 95 to 50 mol % of a phenol selected from mono-, di- and tri-methyl phenols other than 3,4-xylenol to polycondensation together with an aldehyde, and a 1,2-quinonediazide compound, and (B) which has sensitivity to i-ray. There is also provided a method of forming a pattern, which comprises: (1) applying the i-ray sensitive positive resist composition to a wafer to form a photosensitive layer, (2) irradiating the photosensitive layer with i-ray through a predetermined pattern, and (3) developing the pattern with a developer.

6 Claims, No Drawings

I-RAY SENSITIVE POSITIVE RESIST COMPOSITION

DETAILED DESCRIPTION OF THE INVENTION

The present invention relates to an i-ray sensitive positive resist composition and a method of forming a pattern. More specifically, it relates to a positive resist composition suitable as a resist which is sensitive to i-ray and used for manufacturing highly integrated circuits, and a method of forming a pattern therefrom.

A positive resist gives a resist pattern having high resolution and hence, is often used for manufacturing integrated circuits. With a progress in the integration of integrated circuits in recent years, it is desired to develop a positive resist capable of forming a resist pattern having higher resolution. Further, with an advance in the technology for manufacturing integrated circuits, a highly sensitive positive resist having high yielding efficiency is desired.

However, when the interval between patterns to be formed is 0.8 μm or less, conventional positive resists are not satisfactory in the development and pattern formability in portions such as a fine pattern and holes where an exposure dose is small.

Further, with an improvement in the integration of integrated circuits, the wafer etching method is shifting from a wet etching method causing a large side etching to a dry etching method causing a less side etching. In the dry etching method, a resist pattern is required not to alter under heat during the etching, and a positive resist is therefore required to have heat resistance. However, conventional positive resist cannot be said to have sufficient heat resistance.

Japanese Laid-open Patent Publication No. 108054/1990 discloses a radiation-sensitive resin composition containing, as an alkali-soluble novolak resin, a mixture of 95 to 50 parts by weight of a resin A having a weight average molecular weight, as a standard polystyrene, of 4,000 to 20,000 and 5 to 50 parts by weight of a resin B having a weight average molecular weight, as a standard polystyrene, of 200 to 2,000. In the above composition, the resin A refers to a resin obtained by carrying out the polycondensation of m-cresol and at least one of phenols of the formulae,

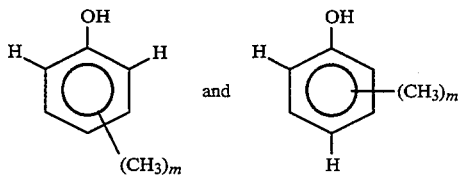

wherein m is 2 or 3, with an aldehyde, or a resin obtained by carrying out the polycondensation of m-cresol, p-cresol and at least one of the phenols of the above formulae with an aldehyde. The resin B refers to a resin obtained by carrying out the polycondensation of a phenol of the formula,

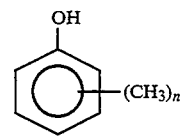

wherein n is 0, 1, 2 or 3, with an aldehyde.

The above composition containing both the resin A and the resin B as an alkali-soluble novolak resin is characterized in that it gives a positive resist having high sensitivity, excellent developability, high resolution and excellent heat resistance.

Japanese Laid-open Patent Publication No. 5955/1990 discloses a positive radiation-sensitive resist composition which contains an alkali-soluble resin containing a polyphenol of the formula, $$X-\alpha-H$$

wherein X is

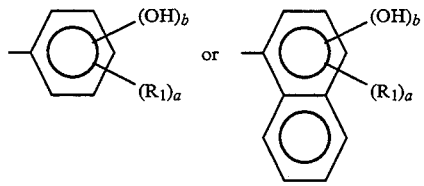

and $\alpha$ is a recurring unit,

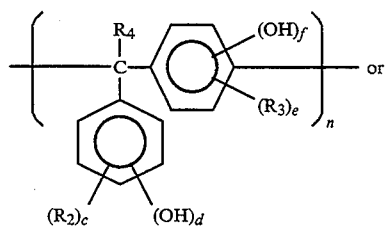

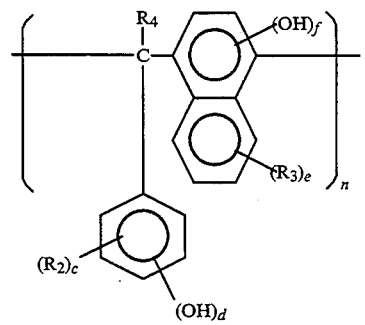

in which n is a number of not less than 1, each of a, b, c, d, e and f is a number of from 0 inclusive to 3 inclusive, d+f is not less than 1, each of $R_1$, $R_2$ and $R_3$ is, independently of the others, a $C_1$-$C_{14}$ alkyl group, a $C_1$-$C_{14}$ alkoxy group, a carboxyl group or a halogen atom, and $R_4$ is a hydrogen atom, a $C_1$-$C_{14}$ alkyl group or a $C_6$-$C_{10}$ aryl group, and a 1,2-quinonediazide compound.

According to the above Publication, the above composition containing an alkali-soluble resin containing a polyphenol has its characteristic features in that it is excellent in sensitivity, resolution and heat resistance.

Japanese Laid-open Patent Publication No. 0252/1991, laid open after the priority date of the present application, discloses a positive resist composition containing an alkali-soluble phenolic resin, a quinonediazide sulfonate-containing sensitizer, and a compound of the formula,

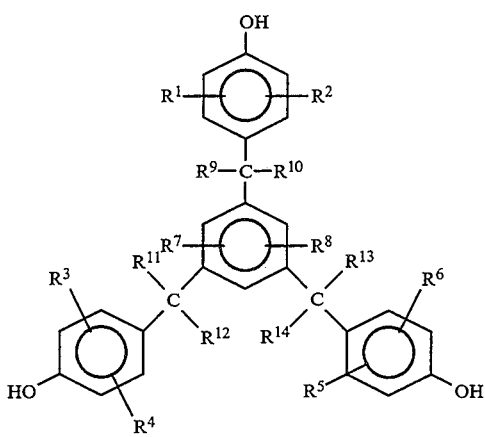

wherein
$R^1$ to $R^6$ are H, halogen, $C_1$-$C_4$ alkyl, alkenyl or OH,
$R^7$ and $R^8$ are H, halogen or $C_1$-$C_4$ alkyl,
$R^9$ to $R^{14}$ are H or $C_1$-$C_6$ alkyl,
and/or a compound of the formula,

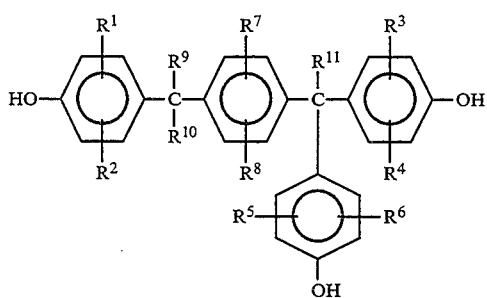

wherein $R^1$ to $R^{11}$ are as defined in the above formula.

The above Publication describes that the above positive resist composition containing polyphenolic compound(s) of the above formula(e) is excellent in sensitivity, resolution, remained thickness ratio, heat resistance and storage stability, and suitable for fine processing in the interval of 1 μm or less.

Meanwhile, conventional positive resists generally have a trade-off relationship in which those having higher sensitivity are inferior in critical resolution, while those having lower sensitivity are superior in critical resolution. As a result, conventional positive resists tend to have low sensitivity in order to attain high resolution, and this tendency is a problem in manufacturing semiconductors in view of productivity.

Further, in conventional positive resists, phenolic resins (cresol novolak In general) used as a base resin undergo oxidation decomposition due to oxygen in atmosphere or in a solvent, and during a long period of time, these resins suffer a change in sensitivity and viscosity. It therefore cannot be said that their storage stability is sufficient.

It is an object of the present invention to provide an i-ray sensitive positive resist composition, which has various excellent performances.

It is another object of the present invention to provide an i-ray sensitive positive resist composition, which can gain high sensitivity without impairing resolution and which is excellent in heat resistance, remained thickness ratio, developability and a pattern form and suitable as a positive resist.

It is further another object of the present invention to provide an i-ray sensitive positive resist composition, which has high sensitivity and is excellent in heat resistance, resolution, remained thickness ratio, developability and a pattern form and which is excellent in storage stability in particular.

It is yet another object of the present invention to provide an i-ray sensitive positive resist composition which does not suffer or hardly suffers a change in viscosity and a decline in sensitivity during the storage even for a long period of time, or which is excellent in storage stability.

It is still further another object of the present invention to provide a method of forming a resist pattern from the above i-ray sensitive positive resist composition.

The above objects and advantages and other objects and advantages of the present invention will be apparent from the following description.

According to the present invention, the above objects and advantages of the present Invention are achieved, first, by an i-ray sensitive positive resist composition:

(A) which comprises an alkali-soluble novolak resin obtained by subjecting a phenolic mixture of 5 to 95 mol % of 2,3-xylenol with 95 to 5 mol % of a phenol of the formula (1),

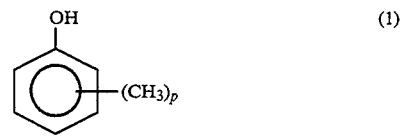

wherein p is 1, 2 or 3, provided that when p is 2, there is excluded a case where one $CH_3$ is on the 2-position and the other $CH_3$ group is on the 3-position, to polycondensation together with an aldehyde, and a 1,2-quinonediazide compound, and (B) which has sensitivity to i-ray.

The composition of the present invention will be detailed hereinafter. [Alkali-soluble novolak resin]

The alkali-soluble novolak resin to be used in this invention refers to a resin obtained by subjecting 2,3-xylenol and a specific phenol as essential phenols to polycondensation together with an aldehyde.

The specific phenol has the above formula (1), in which p is 1, 2 or 3. The phenol of the formula (1) does not include 2,3-xylenol. Examples of the specific phenol include m-cresol, p-cresol, 2,5-xylenol, 3,4-xylenol, 3,5-xylenol. 2,3,5-trimethylphenol and 3,4,5-trimethylphenol. Of these, preferred are m-cresol, p-cresol, 2,5-xylenol, 3,4-xylenol. 3,5-xylenol and 2,3,5-trimethylphenol. These phenols may be used alone or in combination of two or more.

For the production of the novolak resin, the 2,3-xylenol/specific phenol molar ratio is 5/95 to 95/5, preferably 5/95 to 90/10, more preferably 10/90 to 70/30. When the amount of 2,3-xylenol is less than 5 mol %, it is difficult to obtain high sensitivity. When it exceeds 95 mol %, the resolution decreases.

In addition to 2,3-xylenol and the specific phenol, the phenolic mixture for the preparation of the novolak resin may contain not more than 5 mol %, based on the phenolic mixture, of other phenols which are not included in the above formula (1) and are not 2,3-xylenol.

For the production of the, novolak resin, the aldehyde is selected from formaldehyde, benzaldehyde, acetaldehyde, propylaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-chlorobenzaldehyde, m-chorobenzaldehyde, p-chlorobenzaldehyde, o-nitrobenzaldehyde, m-nitrobenzaldehyde. p-nitrobenzaldehye, o-methylbenzaldehyde, m-methylbenzaldehyde, p-methylbenzaldehyde, p-ethylbenzaldehyde, p-n-butylbenzaldehyde, and furfural. Formaldehyde is particularly preferred.

As a formaldehyde-generating source, used are formalin, trioxane, paraformaldehyde, and hemiformals such as methylhemiformal, ethylhemiformal, propylhemiformal, butylhemiformal, and phenylhemiformal.

The above aldehydes may be used alone or in combination of two or more.

The amount of the aldehyde for use per mole of the phenolic mixture containing 2,3-xylenol and the specific phenol is preferably 0.7 to 3 mol, more preferably 0.8 to 1.5 mol.

The phenolic mixture and the aldehyde are subjected to polycondensation in the presence of a catalyst. The catalyst is, in general, selected from inorganic acids such as hydrochloric acid, nitric acid and sulfuric acid, and organic acids such as formic acid, oxalic acid and acetic acid. The amount of the catalyst for use per mole of tile specific phenol is preferably $1\times10^{-5}$ to $5\times10^{-1}$ mol, more preferably $1\times10^{-4}$ to $1\times10^{-1}$.

In the polycondensation, water is generally used as a reaction medium. When, however, the specific phenol is not dissolved in an aqueous solution of the aldehyde, or when a mixture of these components is nonuniform from the beginning of the reaction, a hydrophilic solvent may be used, in combination, as a reaction medium. Such hydrophilic solvent is selected from alcohols such as methanol, ethanol, propanol and butanol, and cyclic ethers such as tetrahydrofuran and dioxane. The amount of the reaction medium per 100 parts by weight of the reaction materials is generally 20 to 1,000 parts by weight.

The temperature for the polycondensation is suitably adjusted depending upon the reactivity of the reaction materials. In general, the temperature for the polycondensation is between 10° C. and 200° C., preferably between 70° C. and 150° C.

For the polycondensation, there may be employed a method in which 2,3-xylenol, the specific phenol, the aldehyde and the catalyst are charged in one lot or a method in which 2,3-xylenol, the specific phenol and the aldehyde are gradually added according as the reaction proceeds in the presence of the catalyst.

After the polycondensation finished, in order to remove unreacted materials, the catalyst, the reaction medium, etc. which are present in the reaction system, the temperature of the system is, in general, elevated up to the temperatures between 130° and 230° C., and volatiles are distilled off under reduced pressure, e.g., about 20 to 50 mmHg. And, the resulting novolak resin (to be referred to as "novolak resin (A)" hereinafter) is recovered.

It is preferred that the weight average molecular weight (to be referred to as "Mw" hereinafter), as a polystyrene, of the novolak resin (A) used in the present invention be generally 3,000 to 20,000, particularly 4,000 to 15,000. When Mw exceeds 20,000, it is difficult to apply the composition of the present invention on a wafer uniformly, and its developability and sensitivity decrease. When Mw is less than 3,000, the heat resistance is liable to decrease.

A novolak resin (A) containing a decreased content of the low molecular weight resin and having a high Mw can be obtained, for example, by dissolving the above-recovered novolak resin (A) in a good solvent such as 2-ethoxyethyl acetate, dioxane, methanol or ethyl acetate, mixing a poor solvent such as water, n-hexane, n-heptane, toluene or xylene with the resultant solution, separating a resin solution layer precipitated, and recovering the resultant novolak resin (A) having a high molecular weight.

The i-ray sensitive positive resist composition, provided by the present invention, may contain one or more types of novolak resins (A) produced under the above-described conditions.

In order to improve the solubility of the novolak resin (A) in an alkali, a low molecular weight phenolic compound is preferably incorporated as a dissolution promoter. As a low molecular weight phenolic compound, phenolic compounds having about 2 to about 6 phenol rings can be suitably used. Although not specially limited, the low molecular weight phenolic compound is selected, for example, from the following compounds (A) to (K).

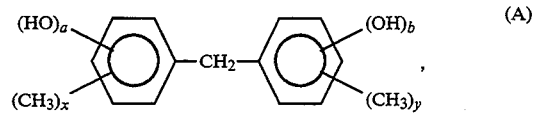

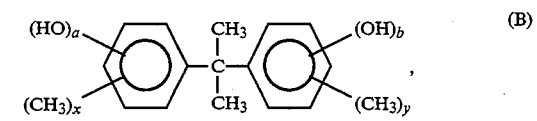

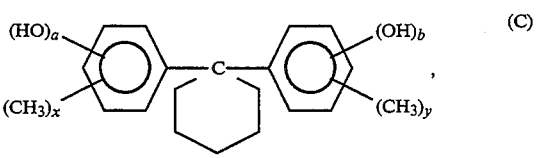

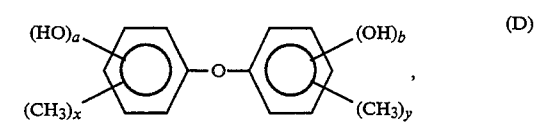

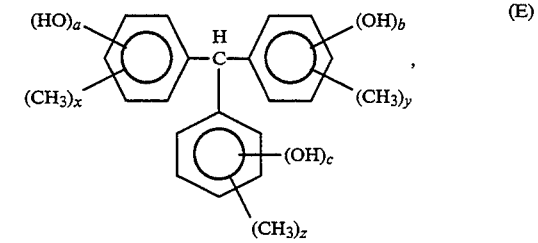

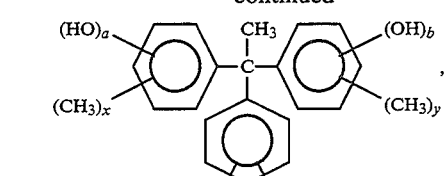
(F)

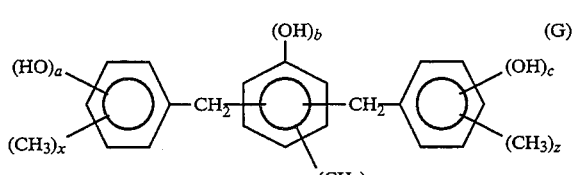
(G)

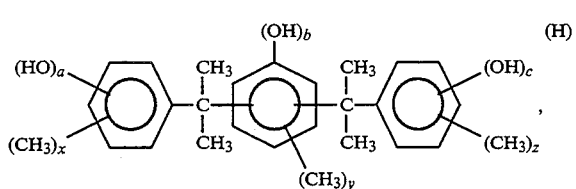
(H)

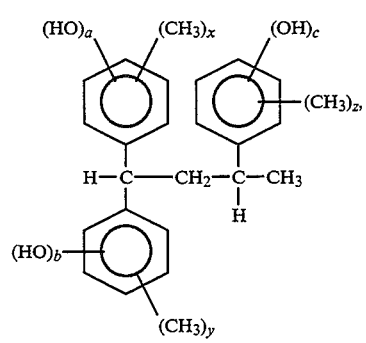
(I)

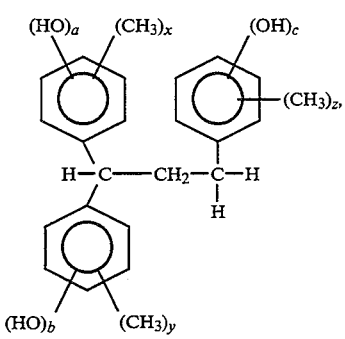
(J)

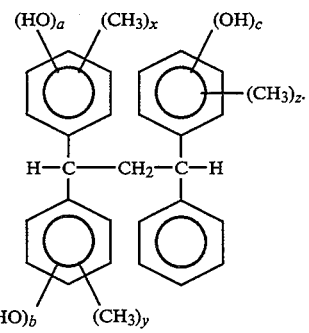
(K)

In the above formulae, each of a, b and c is 0 to 3 provided that a case where all of a, b and c are zero is excluded, and each of x, y and z is 0 to 3 provided that none of (a+x), (b+y) and (c+z) exceed 4. Of the above compounds, preferred are the compounds (F) and (I).

The amount of tile above dissolution promoter for use per 100 parts by weight of the novolak resin (A) is generally not more than 50 parts by weight, preferably 5 to 40 parts by weight.

The above purpose call be also achieved by incorporating, as a solubility promoter, an alkali-soluble novolak resin or an alkali-soluble resol resin (to be simply referred to as "resin (B)" hereinafter) which are produced to have a low molecular weight.

The above resin (B) is produced by the polycondensation of a phenol and an aldehyde. The phenol is selected not only from 2,3-xylenol and those phenols included In the specific phenol (which are used for the synthesis of the novolak resin (A)) but also from phenol, 1-naphthol and 2-naphthol. The aldehyde is also selected from those used for the synthesis of the novolak resin (A). The amount of the above aldehyde for use per mole of the above phenol is preferably 0.1 to 3 mol, more preferably 0.2 to 1.5 mol. In the above polycondensation, there may be used not only the same acidic catalysts as those used for the synthesis of the novolak resin (A) but also alkaline catalysts.

The Mw of the resin (B) is generally not more than 10,000, preferably 200 to 2,000, more preferably 300 to 1,000. The resin (B) includes a phenol/formaldehyde condensation novolak resin, a m-cresol/formaldehyde condensation novolak resin, an o-cresol/formaldehyde condensation novolak resin, and a m-cresol/p-cresol/-formaldehyde novolak resin. The resin (B) is generally used in an amount of not more than 50 parts by weight per 100 parts by weight of the novolak resin (A).

The positive resist composition of the present invention contains the above alkali-soluble novolak resin and a 1,2-quinonediazide compound to be described later. Owing to the use of the alkali-soluble novolak resin obtained from the phenol having the specific structure, the i-ray sensitive positive resist composition, provided by the present invention, is free from degradation of resolution and can be used as a positive resist which has high sensitivity and is excellent in heat resistance, remained thickness ratio, developability and pattern form.

The study by the present inventors also showed the following: When the phenol of the above formula (1) in the above positive resist composition of the present invention is 3,4-xylenol and makes up 5 to 50 mol % of the phenolic mixture, that is, when there is used an alkali-soluble novolak resin obtained from a phenolic mixture containing 5 to 50 mol % of 3,4-xylenol and 95 to 50 mol % of 2,3-xylenol, tile resultant positive resist composition of the present invention shows very little change with time in sensitivity and resolution even during the storage for a long time or excellent storage stability as well as the above excellent properties.

Furthermore, the present inventors have also found that when the phenolic mixture of which 5 to 50 mol % is formed of 3,4-xylenol Is used, the other component of the phenolic mixture may be not only 2,3-xylenol but also a phenol of the formula (1)',

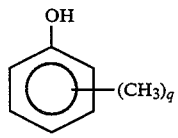
(1)' wherein q is 1, 2 or 3, provided that when q is 2, there is excluded a case where one CH₃ is on the 3-position and the other CH₃ is on the 4-position, and that such a phenolic mixture can also give the positive resist composition of the present invention which is as well excellent in storage stability as described above.

In the second place, therefore, the present invention gives an i-ray sensitive positive resist composition (to be referred to as "second composition" hereinafter):

(A) which comprises an alkali-soluble novolak resin obtained by subjecting a phenolic mixture of 5 to 50 mol % of 3,4-xylenol with 95 to 50 mol % of a specific phenol of the formula (1)',

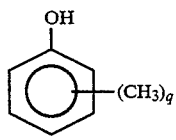 (1)' wherein q is 1, 2 or 3, provided that when q is 2, there is excluded a case where one CH₃ is on the 3-position and the other CH₃ group is on the 4-position, to polycondensation together with an aldehyde, and a 1,2-quinonediazide compound, and (B) which has sensitivity to i-ray.

In the above second composition of the present invention, the phenol preferably comprises 2,3-xylenol and m-cresol. That is, the phenolic mixture preferably comprises 2,3-xylenol, 3,4-xylenol and m-cresol, and it preferably comprises, based on the total molar weight of these components, 5 to 90 mol % of 2,3-xylenol, 5 to 50 mol % of 3,4-xylenol and 5 to 90 mol % of m-cresol.

[Alkali-soluble novolak resin]

The alkali-soluble novolak resin used in the second composition of the present invention is produced by subjecting 3,4-xylenol and a specific phenol of the above formula (1)' as essential components to polycondensation together with an aldehyde.

The specific phenol of the above formula (1)' includes m-cresol, p-cresol, 2,5-xylenol, 2,3-xylenol, 3,5-xylenol, 2,3,5-trimethylphenol and 3,4,5-trimethylphenol. Of these, preferred are m-cresol, p-cresol, 2,5-xylenol, 2,3-xylenol, 3,5-xylenol and 2,3,5-trimethylphenol. These phenols may be used alone or in combination of two or more.

For the production of the novolak resin, the molar ratio of 3,4-xylenol and the specific phenol of the formula (1)' is 5/95 to 50/50, preferably 10/90 to 45/55, more preferably 10/90 to 40/60. When the amount of 3,4-xylenol is less than 5 mol %, there is hardly an effect on the storage stability. When it exceeds 50 mol %, the sensitivity is liable to be low.

In addition to 3,4-xylenol and the specific phenol of the formula (1)', the phenolic mixture for the preparation of the novolak resin may contain not more than 5 mol %, based on the phenolic mixture, of other phenols which are not included in the above formula (1)' and are not 3,4-xylenol.

It should be understood that the description made on the alkali-soluble novolak resin before the second composition can be applied to the alkali-soluble novolak resin of the second composition of tile present invention except for the above phenolic mixture.

The other components in the composition of the present invention (including the second composition) will be described.

[1,2-Quinonediazide compound]

The 1,2-quinonediazide compound used in the composition of the present invention includes, for example, 1,2-benzoquinonediazide-4-sulfonic acid ester, 1,2-naphthoquinonediazide-4-sulfonic acid ester, 1,2-naphthoquinonediazide-5-sulfonic acid ester, and 1,2-naphthoquinonediazide-6-sulfonic acid ester.

Preferred as a 1,2-quinonediazide compound are specifically 1,2-benzoquinonediazide-4-sulfonic acid ester, 1,2-naphthoquinonediazide-4-sulfonic acid ester, 1,2-naphthoquinonediazide-5-sulfonic acid ester or 1,2-naphthoquinonediazide-6-sulfonic acid ester of phenolic compound of the formula (Q1)

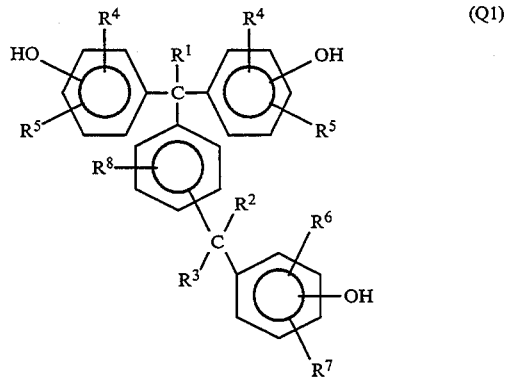

wherein each of $R^1$ to $R^8$ is, independently of others, a hydrogen atom or an alkyl group; 1,2-benzoquinonediazide-4-sulfonic acid ester, 1,2-naphthoquinonediazide-4-sulfonic acid ester, 1,2-naphthoquinonediazide-5-sulfonic acid esters or 1,2-naphthoquinonediazide-6-sulfonic acid ester of phenolic compound of the formula (Q2)

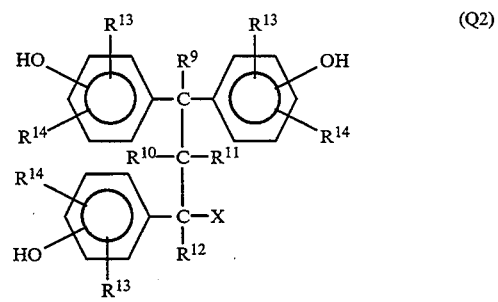

wherein each of $R^9$ to $R^{14}$ is, independently of others, a hydrogen atom or an alkyl group, and X is a hydrogen atom, an alkyl group or an aryl group; 1,2-benzoquinonediazide-4-sulfonic acid ester, 1,2-naphthoquinonediazide-4-sulfonic acid ester, 1,2-naphthoquinonediazide-5-sulfonic acid ester or 1,2-naphthoquinonediazide-6-sulfonic acid ester of (poly)hydroxybenzene such as p-cresol, resorcinol, pyrogallol or fluoroglycinol; 1,2-benzoquinonediazide-4-sulfonic acid ester, 1,2-naphthoquinonediazide-4-sulfonic acid ester, 1,2-naphthoquinonediazide-5-sulfonic acid ester or 1,2-naphthoquinonediazide-6-sulfonic acid ester of (poly)-hydroxyphenyl alkyl ketone or (poly)hydroxyphenyl aryl ketone such as 2,4-dihydroxyphenyl propyl ketone, 2,4-dihydroxyphenyl-n-hexyl ketone, 2,4-dihydroxybenzophenone, 2,3,4-trihydroxyphenyl-n-hexyl ketone, 2,3,4-trihydroxybenzophenone, 2,4,6-trihydroxybenzophenone, 2,3,4,4'-tetrahydroxybenzophenone, 2,2', 3,4-tetrahydroxybenzophenone, 3'-methoxy-2,3,4,4'-tetrahydroxybenzophenone, 2,2', 4,4'-tetrahydroxybenzophenone, 2,2',3,4,6'-pentahydroxybenzophenone, 2,3,3',4,4', 5'-hexahydroxybenzophenone or 2,3',4,4',5',6-hexahydroxybenzophenone; 1,2-benzoquinonediazide-4-sulfonic acid ester, 1,2-naphthoquinonediazide-4-sulfonic acid ester, 1,2-naphthoquinonediazide-5-sulfonic acid ester or 1,2-naphthoquinonediazide-6-sulfonic acid ester of bis[(poly)hydroxyphenyl]alkane such as bis(4-hydroxyphenyl)methane, bis(2,4-dihydroxyphenyl)methane, bis(2,3,4-trihydroxyphenyl)methane, 2,2-bis(4-hydroxyphenyl)propane, 2,2-bis(2,4-dihydroxyphenyl)propane or 2,2-bis(2,3,4-trihydroxyphenyl)propane; 1,2-benzoquinonediazide-4-sulfonic acid ester, 1,2-naphthoquinonediazide-4-sulfonic acid ester, 1,2-naphthoquinonediazide-5-sulfonic acid ester or 1,2-naphthoquinonediazide-6-sulfonic acid ester of (poly)hydroxytriphenylalkane such as 4,4'-dihydroxytriphenylmethane, 4,4', 4''-trihydroxytriphenylmethane, 2,2', 5,5'-tetramethyl-2'', 4,4'-trihydroxytriphenylmethane, 3,3', 5,5'-tetramethyl-2'', 4,4'-trihydroxytriphenylmethane, 4,4', 5,5'-tetramethyl-2,2', 2''-trihydroxytriphenylmethane, 2,2', 5,5'-tetramethyl-4,4', 4''-trihydroxytriphenylmethane, 1,1,1-tris(4-hydroxyphenyl)ethane or 1,1-bis(4-hydroxyphenyl)-1-phenylethane; 1,2-benzoquinonediazide-4-sulfonic acid ester, 1,2-naphthoquinonediazide-4-sulfonic acid ester, 1,2-naphthoquinonediazide-5-sulfonic acid ester or 1,2-naphthoquinonediazide-6-sulfonic acid ester of (poly)hydroxybenzoic acid alkyl ester or (poly)hydroxybenzoic acid aryl ester such as lauryl 3,5-dihydroxybenzoate, phenyl 2,3,4-trihydroxybenzoate, lauryl 3,4,5-trihydroxybenzoate, propyl 3,4,5-trihydroxybenzoate or phenyl 3,4,5-trihydroxybenzoate; 1,2-benzoquinonediazide-4-sulfonic acid ester, 1,2-naphthoquinonediazide-4-sulfonic acid ester, 1,2-naphthoquinonediazide-5- sulfonic acid ester or 1,2-naphthoquinonediazide-6- sulfonic acid ester of bis[(poly)hydroxybenzoyl]alkane or bis[(poly)hydroxybenzoyl]benzene such as bis(2,5-dihydroxybenzoyl]methane, bis(2,3,4-trihydroxybenzoyl)methane, bis(2,4,6-trihydroxybenzoyl)methane, p-bis(2,5-dihydroxybenzoyl)benzene, p-bis(2,3,4-trihydroxybenzoyl)benzene or p-bis(2,4,6-trihydroxybenzoyl)benzene; 1,2-benzoquinonediazide-4sulfonic acid ester, 1,2-naphthoquinonediazide-4-sulfonic acid ester, 1,2-naphthoquinonediazide-5-sulfonic acid ester or 1,2-naphthoquinonediazide-6-sulfonic acid ester of polyethylene glycol di[(poly)hydroxybenzoate] such as ethylene glycol-di( 3,5-dihydroxybenzoate), polyethylene glycol-di(3,5-dihydroxybenzoate) or polyethylene glycol-di(3,4,5-trihydroxybenzoate); 1,2-benzoquinonediazide-4-sulfonic acid ester, 1,2-naphthoquinonediazide-4-sulfonic acid ester, 1,2-naphthoquinonediazide-5-sulfonic acid ester or 1,2-naphthoquinonediazide-6-sulfonic acid ester of polyhydroxyphenylflavan such as 2,4,4-trimethyl-2',4',7-trihydroxy-2-phenylflavan or 2,4,4'-trimethyl-2',4',5',6,7-pentahydroxy-2-phenylflavan; and 1,2-benzoquinonediazide-4-sulfonic acid ester, 1,2-naphthoquinonediazide-4-sulfonic acid ester, 1,2-naphthoquinonediazide-5-sulfonic acid ester or 1,2-naphthoquinonediazide-6-sulfonic acid ester of the resin (B).

Of the above-described 1,2-quinonediazide compounds, preferred are 1,2-quinonediazide-5-sulfonic acid esters of the phenolic compounds of the formula (Q1) and 1,2-quinonediazide-5-sulfonic acid esters of the phenolic compounds of the formula (Q2).

Of the 1,2-quinonediazide-5-sulfonic acid esters of phenolic compounds of the above formula (Q1), more preferred are 1,2-quinonediazide-5-sulfonic acid ester of phenolic compound of the formula (Q1)-a,

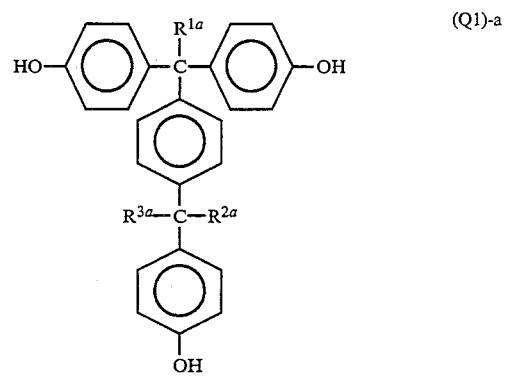

(Q1)-a wherein each of $R^{1a}$, $R^{2a}$ and $R^{3a}$ is, independently of others, a hydrogen atom, a methyl group or an ethyl group.

Of the 1,2-quinonediazide-5-sulfonic acid esters of the phenolic compounds of the above formula (Q2), more preferred are 1,2-quinonediazide-5-sulfonic acid ester of phenolic compound of the formula (Q2)-a,

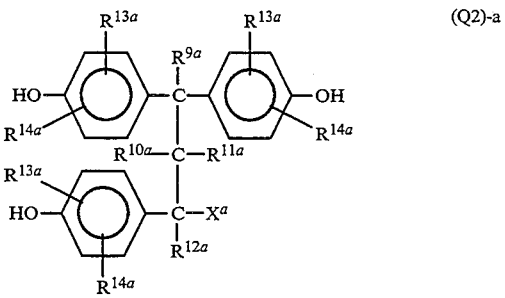

(Q2)-a wherein each of $R^{9a}$, $R^{10a}$, $R^{11a}$ and $R^{12a}$ is, independently of others, a hydrogen atom, a methyl group or an ethyl group, each of $R^{13a}$ and $R^{14A}$ is, independently of other, a methyl group or an ethyl group, and $X^a$ is a hydrogen atom, a methyl group, an ethyl group or a phenyl group.

Of the above 1,2-quinonediazide compounds, particularly preferred are 1,2-quinonediazide-5-sulfonic acid esters of phenolic compounds selected from 1,1-bis(4-hydroxyphenyl)-4-[1-(4-hydroxyphenyl)-1-methylethyl]-1-phenylethane, 1,1,3-tris(4-hydroxy-2,5-dimethylphenyl)propane, 1,1,3-tris(4-hydroxy-2,5-dimethylphenyl)butane and 1,1,3-tris(4-hydroxy-2,5-dimethylphenyl)-3-phenylpropane.

In the composition of the present invention, the amount of the 1,2-quinonediazide compound for use per 100 parts by weight of the novolak resin (A) is generally 3 to 100 parts by weight, preferably 5 to 50 parts by weight.

[Additives]

The composition of the present invention may contain additives such as a sensitivity promoter, a surfactant, etc.

The sensitivity promoter is incorporated to improve the sensitivity of the resist. The sensitivity promoter is selected from 2H-pyrid-(3,2-b)-1,4-oxazin-3(4H)-ones, 10H-pyrid-(3,2-b)-(1,4-benzothiazines, urazols, hydantoins, barbituric acids, glycine anhydrides, 1-hydroxybenzotriazoles, alloxans and maleimides. The sensitivity promoter is used generally in an amount of not more than 50 parts by weight per 100 parts by weight of the novolak resin (A).

The surfactant is incorporated to improve the coatability and developability of the composition of the present invention. The surfactant is selected from nonionic surfactants such as polyoxyethylene lauryl ether, polyoxyethylene oleyl ether, polyoxyethylene octylphenyl ether, polyoxyethylene nonylphenyl ether, polyethylene glycol dilaurate and polyethylene glycol distearate; fluorine-containing surfactants such as F-Top EF301, EF303 and EF 352 (trade names, supplied by Shin Akita Kasei K.K.), Megafac F171, F172 and F173 (trade names, supplied by Dainippon Ink and Chemicals Inc.), Fluorad FC430 and FC431 (trade names, supplied by Sumitomo 3M Co., Ltd, Asahi Guard AG710, Surflon S-382, SC-101, SC-102, SC-103, SC-104, SC-105 and SC-106 (trade names, supplied by Asahi Glass Co,, Ltd.); Organosiloxane polymer KP3411 (trade name, supplied by The Shin-Etsu Chemical Co., Ltd.), and acrylic acid-containing or methacrylic acid-containing (co)polymers Polyflow No. 75 and No. 95 (trade names, supplied by Kyoeisha Chemical Co., Ltd.

The surfactant is used generally in an amount of not more than 2 parts by weight per 100 parts by weight of the solid content of the composition.

Further, the composition of the present invention may contain a dye and a pigment to visualize a latent image on an i-ray-irradiated portion and decrease an influence of halation during the irradiation with i-ray. It may also contain an adhesion aid to improve adhesion. Further, it may also contain a storage stabilizer and an antifoamer as required.

[Preparation of Composition and Formation of Pattern]

The composition of the present invention is produced, for example, by dissolving the above-described novolak resin and other additives in a solvent to prepare a solution which preferably has a solid concentration of 20 to 40% by weight, more preferably 22 to 32% by weight, and filtering the solution with a filter having a pore diameter of about 0.2 μm.

The above solvent is selected from glycol ethers such as ethylene glycol monomethyl ether and ethylene glycol monoethyl ether; ethylene glycol alkyl ether acetates such as 2-methoxethyl acetate and 2-ethoxyethyl acetate; diethylene glycols such as diethylene glycol monomethyl ether and diethylene glycol monoethyl ether; propylene glycol alkyl ether acetates such as propylene glycol methyl ether acetate and propylene glycol propyl ether acetate; aromatic hydrocarbons such as toluene and xylene; ketones such as methyl ethyl ketone and cyclohexanone; and esters such as ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, ethyl acetate and butyl acetate.

These organic solvents may be used alone or in combination.

Further, the following high-boiling-point solvents may be incorporated; N-methylformamide, N,N-dimethylformamide, N-methylformanilide, N-methylacetamide, N,N-dimethylacetamide, N-methylpyrrolidone, dimethyl sulfoxide, benzyl ethyl ether, dihexyl ether, acetonyl acetone, isophorone, caproic acid, caprilic acid, 1-octanol, 1-nonanol, benzyl alcohol, benzyl acetate, ethyl benzoate, diethyl oxalate, diethyl maleate, γ-butyrolactone, ethylene carbonate, propylene carbonate and phenyl cellosolve acetate.

According to the present invention, a pattern is formed by a method of forming a pattern, which comprises:

(1) applying the positive resist composition of the present invention to a wafer to form a photosensitive layer, (2) irradiating said photosensitive layer with i-ray through a predetermined pattern, and (3) developing the pattern with a developer.

In the above step (1), the composition of the present invention is applied to a silicon wafer or a wafer coated with aluminum, or the like by coating means such as rotational coating, flow coating, roll coating, etc. to form a photosensitive layer.. In the step (2), the photosensitive layer is irradiated with i-ray through a predetermined mask pattern, and, in the step (3), the pattern is developed with a developer, whereby a pattern is formed.

In the above method of the present invention, a step of prebaking the photosensitive layer may be carried out between the above steps (1) and (2). Further, a step of a post exposure baking may be carried out between the above steps (2) and (3).

The temperature for the prebaking is preferably between 50° C. and 130° C. The temperature for the post exposure baking is between 70° C. and 140° C.

As the developer for the composition of the present invention, there is used an alkaline aqueous solution in which an alkaline compound is dissolved in a concentration of, usually, 1 to 10% by weight, preferably 2 to 5% by weight. The alkaline compound is selected from sodium hydroxide, potassium hydroxide, sodium carbonate, sodium silicate, sodium metasilicate, ammonia water, ethyl amine, n-propylamine, diethylamine, di-n-propylamine, triethylamine, methyldiethylamine, dimethylethanolamine, triethanolamine, tetramethylammonium hydroxide, tetraethylammonium hydroxide, choline, pyrrole, piperidine, 1,8-diazabicyclo-(5,4,0)-7-undecene, and 1,5-diazabicyclo-(4,3,0)-5-nonane.

The developer may further contain a suitable amount of a water-soluble organic solvent, which is selected from alcohols such as methanol and ethanol, and a surfactant. When the development is carried out with such an alkaline aqueous solution, in general, the photosensitive layer is rinsed with water.

The present invention will be explained in detail by reference to Examples. However, the present invention shall not be limited to these Examples.

In Examples, the measurement for Mw's and the evaluation on resists were carried out as follows.

Mw

Measured by gel permeation chromatography using GPC columns (two columns of G2000H6, one column of G3000H6 and one column of G4000H6) supplied by Tosoh Corporation under the analysis conditions where the flow rate was 1.5 ml/minute, the elution solvent was tetrahydrofuran, the column temperature was 40° C. and monodisperse polystyrene was used as the standard.

Sensitivity

Coated compositions were exposed to i-ray having a wavelength of 365 nm for various exposure times with an NSR-1505i6A reduction projection aligner (numerical apperture: 0.45) supplied by Nikon Corp., and patterns were developed with an aqueous solution containing 2.4% by weight of tetramethylammonium hydroxide at 25° C. for 60 seconds, rinsed with water and dried to form resist patterns on wafers, whereby the exposure time required for forming a 0.6 μm line and space pattern (1LIS) having a line and space width ratio of 1:1 was determined (to be referred to as "optimum exposure time" hereinafter).

Resolution

The dimension of a minimum resist pattern resolved under the exposure for an optimum exposure time was measured.

Remained thickness ratio

The thickness of a pattern developed after the exposure for an optimum exposure time was divided by the thickness of the pattern before the development, and the resultant value was multiplied by 100 and expressed in the unit of %.

Developability

The degrees of scumming and a development residue were examined.

Pattern form

A square cross section of a developed 0.6 μm resist pattern was measured for lengths of the base, A, and the top side, B, with a scanning-type electron microscope and a pattern in the case of $0.85 \leq B/A \leq 1$ was determined as excellent in a pattern form. However, a case where a pattern form having a gradually widened base was not determined as excellent even if the B/A was in the above range.

Heat resistance

A wafer having a resist pattern formed thereon was placed in a clean oven and heated, and the temperature when the pattern began, to break was measured.

Storage stability

A solution of a composition of the present invention just after prepared was measured for its sensitivity and viscosity. Further, part of the solution was sealed in a bottle, stored at 25° C. for 3 months, and then measured for its sensitivity and viscosity, and change ratios of these were determined.

An ELD type viscometer supplied by Tokyo Keikisha was used for the above viscosity measurement.

SYNTHESIS EXAMPLE 1

An autoclave was charged with

| m-cresol | 45.4 g (0.42 mol), |
| --- | --- |
| 2,3-xylenol | 34.2 g (0.28 mol), |
| 37 wt. % formaldehyde solution | 56.8 g (formaldehyde 0.70 mol), |
| oxalic acid dihydrate | 4.41 g (0.035 mol), |
| water | 43.8 g, and |
| dioxane | 239 g | and dipped in an oil bath. While the temperature in the autoclave was kept at 140° C., and the polycondensation was carried out for 7 hours with stirring. After the reaction, the temperature was reduced to room temperature, and the content was taken out into a beaker. After the content was separated into two layers, the lower layer was taken out, concentrated, dehydrated and dried to recover a resin. This resin is referred to as a novolak resin (A1).

SYNTHESIS EXAMPLE 2

An autoclave was charged with

| m-cresol | 53.0 g (0.49 mol), |
| --- | --- |
| 2,3-xylenol | 17.1 g (0.14 mol), |
| 3,4-xylenol | 8.55 g (0.07 mol), |
| 37 wt. % formaldehyde solution | 56.8 g (formaldehyde 0.70 mol), |
| oxalic acid dihydrate | 4.41 g (0.035 mol), |
| water | 52.7 g, and |
| dioxane | 265 g | and, while the temperature inside the autoclave was kept at 120° C., the polycondensation was carried out for 16 hours in the same manner as in Synthesis Example 1 to recover a resin. The resin is referred to as a novolak resin (A2).

SYNTHESIS EXAMPLE 3

An autoclave was charged with

| m-cresol | 60.6 g (0.56 mol), |
| --- | --- |
| 2,3-xylenol | 8.55 g (0.07 mol), |
| 2,3,5-trimethylphenol | 9.53 g (0.07 mol), |
| 37 wt. % formaldehyde solution | 54.0 g (formaldehyde 0.67 mol), |
| oxalic acid dihydrate | 4.41 g (0.035 mol), |
| water | 54.5 g, and |
| dioxane | 265 g | and the polycondensation was carried out for 6 hours in the same manner as In Synthesis Example 1 to recover a resin. The resin is referred to as a novolak resin (A3).

SYNTHESIS EXAMPLE 4

A flask equipped with a stirrer, a cooling tube and a thermometer was charged with:

| m-cresol | 37.9 g (0.35 mol), |
| --- | --- |
| 2,3-xylenol | 18.3 g (0.15 mol), |
| 37 wt. % formaldehyde solution | 77.1 g (formaldehyde 0.95 mol), |
| and | |
| oxalic acid dihydrate | 0.95 g (7.5 × 10$^{-3}$ mol). |

The above flask was dipped in an oil bath, and while the temperature in the flask was kept at 100° C., the polycondensation was carried out for 60 minutes with stirring. Thereafter,

| m-cresol | 37.9 g (0.35 mol) and |
| --- | --- |
| 2,3-xylenol | 18.3 g (0.15 mol) | were added, and the resultant mixture was subjected to polycondensation for 120 minutes.

Then, the temperature of the oil bath was increased up to 180° C., and at the same time, the pressure in the flask was reduced to 30 to 50 mmHg to remove water, oxalic acid, unreacted formaldehyde and unreacted phenols. The temperature of the molten resin was reduced to room temperature, and the resin was recovered. The resin is referred to as a novolak resin (A4).

SYNTHESIS EXAMPLE 5

The novolak resin (A4) was dissolved in 2-ethoxyethyl acetate to prepare a resin solution having a solid content of 20% by weight. Added to this resin solution were 1.25 times as much methanol as the resin solution by weight and water in an amount equivalent to that of the resin solution. The resultant mixture was stirred and then allowed to stand to separate it into two layers, and a resin solution layer (lower layer) was taken out, concentrated, dehydrated and dried to give a resin. The resin is referred to as a novolak resin (A5).

SYNTHESIS EXAMPLE 6

The same flask as that used in Synthesis Example 4 was charged with:

| | |
|---|---|
| m-cresol | 43.3 g (0.40 mol), |
| 2,3-xylenol | 12.2 g (0.15 mol), |
| 3,4-xylenol | 12.2 g (0.10 mol) |
| 37 wt. % formaldehyde solution | 73.0 g (formaldehyde 0.90 mol), |
| and | |
| oxalic acid dihydrate | 1.26 g (0.010 mol). |

While the temperature in the flask was kept at 100° C., the polycondensation was carried out for 60 minutes with stirring. Thereafter,

| | |
|---|---|
| m-cresol | 10.8 g (0.10 mol) and |
| 2,3-xylenol | 36.7 g (0.30 mol) | were added, and the polycondensation was further continued for 120 minutes.

Then, the reaction mixture was treated in the same manner as in Synthesis Example 4 to recover a resin. The resin is referred to as a novolak resin (A6).

SYNTHESIS EXAMPLE 7

The novolak resin (A6) was dissolved in ethyl acetate to prepare a resin solution having a solid content of 30% by weight. Added to this resin solution were 0.35 times as much methanol as the resin solution by weight and 0.75 times as much water as the resin solution by weight. The resultant mixture was stirred and then allowed to stand to separate it into two layers, and a resin solution layer (lower layer) was taken out, concentrated, dehydrated and dried to give a resin. The resin is referred to as a novolak resin (A7).

SYNTHESIS EXAMPLE 8

The same flask as that used in Synthesis Example 4 was charged with:

| | |
|---|---|
| m-cresol | 51.9 g (0.48 mol), |
| p-cresol | 10.8 g (0.10 mol), |
| 2,3-xylenol | 7.33 g (0.060 mol), |
| 37 wt. % formaldehyde solution | 77.1 g (formaldehyde 0.95 mol), |
| and | |
| oxalic acid dihydrate | 1.26 g (0.010 mol), |

While the temperature in the flask was kept at 100° C., the polycondensation was carried out for 60 minutes with stirring. Thereafter,

| | |
|---|---|
| m-cresol | 13.0 g (0.12 mol) and |
| 2,3-xylenol | 29.3 g (0.24 mol) | were added, and the polycondensation was further continued for 140 minutes.

Then, the reaction mixture was treated in the same manner as in Synthesis Example 4 to recover a resin. The resin is referred to as a novolak resin (A8).

SYNTHESIS EXAMPLE 9

The novolak resin (A8) was dissolved in ethyl acetate to prepare a resin solution having a solid content of 30% by weight. Added to this resin solution were methanol and water in amounts equivalent to those of the resin solution by weight and 0.75 times as much water as the resin solution by weight. The resultant mixture was stirred and then allowed to stand to separate it into two layers, and a resin solution layer (lower layer) was taken out, concentrated, dehydrated and dried to give a resin. The resin is referred to as a novolak resin (A9).

SYNTHESIS EXAMPLE 10

An autoclave was charged with

| | |
|---|---|
| m-cresol | 53.0 g (0.49 mol), |
| 3,4-xylenol | 25.7 g (0.21 mol), |
| 37 wt. % formaldehyde solution | 49.7 g (formaldehyde 0.61 mol), |
| oxalic acid dihydrate | 4.41 g (0.035 mol), |
| water | 57.2 g, and |
| dioxane | 265 g, | and dipped in an oil bath. While the temperature in the autoclave was kept at 130° C., the polycondensation was carried out for 8 hours. After the reaction, the temperature was reduced to room temperature, and the content was taken out into a beaker. After the content was separated into two layers, the lower layer was taken out, concentrated, dehydrated and dried to recover a resin. This resin is referred to as a novolak resin (A10).

SYNTHESIS EXAMPLE 11

An autoclave was charged with

| | |
|---|---|
| m-cresol | 60.6 g (0.56 mol), |
| 3,4-xylenol | 8.55 g (0.07 mol), |
| 2,3,5-trimethylphenol | 9.54 g (0.07 mol), |
| 37 wt. % formaldehyde solution | 49.7 g (formaldehyde 0.61 mol), |
| oxalic acid dihydrate | 4.41 g (0.035 mol), |
| water | 57.2 g, and |
| dioxane | 265 g. |

The polycondensation was carried out for 7.5 hours in the same manner as in Example 10 to recover a resin. The resin is referred to as a novolak resin (A11).

SYNTHESIS EXAMPLE 12

An autoclave was charged with

| | |
|---|---|
| m-cresol | 60.6 g (0.56 mol), |
| 3,4-xylenol | 8.55 g (0.07 mol), |
| 2,3-xylenol | 8.55 g (0.07 mol), |
| 37 wt. % formaldehyde solution | 51.1 g (formaldehyde 0.63 mol), |
| oxalic acid dihydrate | 4.41 g (0.035 mol), |

-continued

| | |
|---|---|
| water | 55.7 g, and |
| dioxane | 262 g. |

The polycondensation was carried out for 6 hours in the same manner as in Example 10 to recover a resin. The resin is referred to as a novolak resin (A12).

SYNTHESIS EXAMPLE 13

A flask equipped with a stirrer, a cooling tube and a thermometer was charged with

| | |
|---|---|
| m-cresol | 60.6 g (0.56 mol), |
| 3,4-xylenol | 7.33 g (0.06 mol), |
| 37 wt. % formaldehyde solution | 73.0 g (formaldehyde 0.90 mol), |
| and | |
| oxalic acid dihydrate | 1.26 g (0.01 mol), | and dipped in an oil bath. While the temperature in the flask was kept at 100° C., the polycondensation was carried out for 60 minutes with stirring. Thereafter,

| | |
|---|---|
| m-cresol | 15.1 g (0.14 mol) and |
| 3,4-xylenol | 29.3 g (0.24 mol) | were added, and the polycondensation was further continued for 120 minutes.

Then, the temperature of the oil bath was elevated up to 180° C., and at the same time, the pressure in the flask was reduced to 30 to 50 mmHg to remove water, oxalic acid, unreacted formaldehyde and unreacted phenols. Then, the temperature of the molten resin was reduced to room temperature, and the resin was recovered. The resin is referred to as a novolak resin (A13).

SYNTHESIS EXAMPLE 14

The novolak resin (A13) was dissolved in 2-ethoxyethyl acetate to prepare a resin solution having a solid content of 20% by weight. Added to this resin solution were 0.45 times as much methanol as the resin solution by weight and 1.5 times as much water as the resin solution by weight. The resultant mixture was stirred and then allowed to stand to separate it into two layers, and a resin solution layer (lower layer) was taken out, concentrated, dehydrated and dried to give a resin. The resin is referred to as a novolak resin (A14).

SYNTHESIS EXAMPLE 15

The same flask as that used in Synthesis Example 13 was charged with:

| | |
|---|---|
| m-cresol | 51.9 g (0.48 mol), |
| 3,4-xylenol | 9.77 g (0.08 mol) |
| 37 wt. % formaldehyde solution | 77.1 g (formaldehyde 0.95 mol), |
| and | |
| oxalic acid dihydrate | 1.26 g (0.010 mol). |

While the temperature in the flask was kept at 100° C., the polycondensation was carried out for 40 minutes with stirring. Thereafter,

| | |
|---|---|
| m-cresol | 34.6 g (0.32 mol) and |
| 3,4-xylenol | 14.7 g (0.12 mol) | were added, and the polycondensation was further continued for 80 minutes.

Then, the reaction mixture was treated in the same manner as in Synthesis Example 13 to recover a resin. The resin is referred to as a novolak resin (A15).

SYNTHESIS EXAMPLE 16

The novolak resin (A15) was dissolved in ethyl acetate to prepare a resin solution having a solid content of 30% by weight. Added to this resin solution were 0.35 times as much methanol as the resin solution by weight and 0.75 times as much water as the resin solution by weight. The resultant mixture was stirred and then allowed to stand to separate it into two layers, and a resin solution layer (lower layer) was taken out, concentrated, dehydrated and dried to give a resin. The resin is referred to as a novolak resin (A16).

SYNTHESIS EXAMPLE 17

The same flask as that used in Synthesis Example 13 was charged with:

| | |
|---|---|
| m-cresol | 60.6 g (0.56 mol), |
| p-cresol | 10.8 g (0.10 mol), |
| 3,4-xylenol | 4.89 g (0.040 mol), |
| 37 wt. % formaldehyde solution | 73.0 g (formaldehyde 0.90 mol), |
| and | |
| oxalic acid dihydrate | 1.26 g (0.010 mol). |

While the temperature in the flask was kept at 100° C., the polycondensation was carried out for 60 minutes with stirring. Thereafter,

| | |
|---|---|
| m-cresol | 15.1 g (0.14 mol) and |
| 3,4-xylenol | 19.5 g (0.16 mol) | were added, and the polycondensation was further continued for 150 minutes.

Then, the reaction mixture was treated in the same manner as in Synthesis Example 13 to recover a resin. The resin is referred to as a novolak resin. (A17).

SYNTHESIS EXAMPLE 18

The novolak resin (A17) was dissolved in ethyl acetate to prepare a resin solution having a solid content of 30% by weight, and added to this resin solution was 0.50 times as much hexane as the resin solution by weight. The resultant mixture was stirred and then Allowed to stand to separate it into two layers, and a resin solution layer (lower layer) was taken out, concentrated, dehydrated and dried to give a resin. The resin is referred to as a novolak resin (A18).

SYNTHESIS EXAMPLE 19

An autoclave was charged with:

| | |
|---|---|
| m-cresol | 45.4 g (0.42 mol), |
| 3,4-xylenol | 8.55 g (0.07 mol), |
| 2,3-xylenol | 25.66 g (0.21 mol), |
| 37 wt. % formaldehyde solution | 56.8 g (formaldehyde 0.70 mol), |
| oxalic acid dihydrate | 4.41 g (0.035 mol), |

-continued

| | |
|---|---|
| water | 53.8 g, and |
| dioxane | 265 g, | and dipped in an oil bath. The polycondensation was carried out for 6.0 hours In the same manner as In Synthesis Example 10, and the resultant resin was recovered. The resin is referred to as a novolak resin (A19).

COMPARATIVE SYNTHESIS EXAMPLE 1

The same flask as that used in Synthesis Example 4 was charged with:

| | |
|---|---|
| m-cresol | 51.8 g (0.48 mol), |
| p-cresol | 8.65 g (0.08 mol), |
| 37 wt. % formaldehyde solution | 73.0 g (formaldehyde 0.90 mol), |
| and | |
| oxalic acid dihydrate | 0.63 g (0.005 mol). |

While the temperature in the flask was kept at 100° C., the polycondensation was carried out for 30 minutes with stirring. Thereafter,

| | |
|---|---|
| m-cresol | 13.0 g (0.12 mol) and |
| p-cresol | 34.6 g (0.32 mol) | were added, and the polycondensation was further continued for 60 minutes.

Then, the reaction mixture was treated in the same manner as in Synthesis Example 4 to recover a resin. The resin is referred to as a novolak resin (a1).

COMPARATIVE SYNTHESIS EXAMPLE 2

The novolak resin (a1) was dissolved in ethyl acetate to prepare a resin solution having a solid content of 30% by weight, and added to this resin solution were 1.00 times as much methanol as the resin solution by weight and 1.00 times as much water as the resin solution by weight. The resultant mixture was stirred and then allowed to stand to separate it into two layers, and a resin solution layer (lower layer) was taken out, concentrated, dehydrated and dried to give a resin. The resin is referred to as a novolak resin (a2).

EXAMPLES 1–9 and Comparative Examples 1 and 2

One of the novolak resins (A1) to (A9) synthesized in the above Synthesis Examples and the novolak resins (a1) and (a2) synthesized in the above Comparative Synthesis Examples, one or none of the following compounds (B) as a dissolution promoter, one or two of the following quinonediazide compounds (C) and one of the following solvents were mixed to prepare a homogeneous solution, and the solution was filtered with a membrane filter having a pore diameter of 0.2 μm to obtain a composition (solution).

Compounds (B)

(B1) 1,1,3-tris(2,5-dimethyl-4-hydroxyphenyl)propane
(B2) 1,1,3-tris(2,5-dimethyl-4-hydroxyphenyl)butane
(B3) 1,1-bis(4-hydroxyphenyl)-1-phenylethane
(B4) 1,1,1-tris(4-hydroxyphenyl)ethane
(B5) 1,1-bis(2,5-dimethyl-4-hydroxyphenyl)-1-(2-hydroxyphenyl)methane Quinonediazide Compounds (C)

(C1) condensate from 1 mol of 2,3,4,4'-tetrahydroxybenzophenone and 4 mol of 1,2-naphthoquinonediazide-5-sulfonyl chloride
(C2) condensate from 1 mol of 1,1,1-tris(4-hydroxyphenyl)ethane and 2 mol of 1,2-naphthoquinonediazide-5-sulfonyl chloride
(C3) condensate from 1 mol of 1,1,1-tris(4-hydroxyphenyl)ethane and 2.5 mol of 1,2-naphthoquinonediazide-5-sulfonyl chloride
(C4) condensate from 1 mol of 1,1-bis(4-hydroxyphenyl)-4-[1-(4-hydroxyphenyl)-1-methylethyl]-1-phenylethane and 2 mol of 1,2-naphthoquinonediazide-5-sulfonyl chloride
(C5) condensate from 1 mol of 1,1-bis(4-hydroxyphenyl)-4-[1-(4-hydroxyphenyl)-1-methylethyl]-1-phenylethane and 2.5 mol of 1,2-naphthoquinonediazide-5-sulfonyl chloride
(C6) condensate from 1 mol of 2,4,4-trimethyl-2',4',7-trihydroxy-2-phenylflavan and 2.5 mol of 1,2-naphthoquinonediazide-5-sulfonyl chloride
(C7) condensate from 1 mol of 2,4,4-trimethyl-2',4',7-trihydroxy-2-phenyl flavan and 3 mol of 1,2-naphthoquinonediazide-5-sulfonyl chloride Solvents (α) 2-ethoxyethyl acetate
(β) ethyl 2-hydroxypropionate
(γ) methyl 3-methoxypropionate Table 1 shows the amount of the above components incorporated.

The above-obtained solution was applied onto a silicon wafer having a silicon oxide film surface with a spinner, and then the resultant coating was prebaked on a hot plate at 90° C. for 2 minutes to form a resist film having a thickness of 1.2 μm. The resist film was exposed to light having a wavelength of 365 nm (i-ray) through a reticle, and then subjected to post exposure baking (PEB) on the hot plate at 110° C. for 1 minute. The resist film was developed, rinsed and dried. The resist film so obtained was evaluated on sensitivity, resolution, remained thickness ratio, developability, heat resistance and pattern form.

Table 2 shows the results.

TABLE 1

| | Novolak resin (A) | | | Dissolution promotor (B) | | Quinonediazide comound (C) | | Solvent | |
|---|---|---|---|---|---|---|---|---|---|
| | Kind | Mw | Amount (parts by weight) | Kind | Amount (parts by weight) | Kind | Amount (parts by weight) | Kind | Amount (parts by weight) |
| Example | | | | | | | | | |
| 1 | A1 | 10800 | 100 | B3 | 20 | C2 | 25 | α | 320 |
| 2 | A2 | 12000 | 80 | B2 | 20 | C4 | 25 | β | 320 |
| 3 | A3 | 9800 | 82.5 | B4 | 17.5 | C3 | 22.5 | α | 320 |

TABLE 1-continued

| | Novolak resin (A) | | | Dissolution promotor (B) | | Quinonediazide comound (C) | | Solvent | |
|---|---|---|---|---|---|---|---|---|---|
| | Kind | Mw | Amount (parts by weight) | Kind | Amount (parts by weight) | Kind | Amount (parts by weight) | Kind | Amount (parts by weight) |
| 4 | A5 | 9700 | 80 | B5 | 20 | C7 | 25 | γ | 320 |
| 5 | A6 | 5500 | 100 | — | — | C6 | 25 | β | 320 |
| 6 | A7 | 6500 | 97 | B3 | 3 | C4 | 25 | β | 320 |
| 7 | A8 | 4700 | 100 | — | — | C5 | 20 | γ | 320 |
| 8 | A9 | 9500 | 85 | B1 | 15 | C4/C8 | 20/10 | β | 320 |
| 9 | A6 | 5500 | 100 | — | — | C1/C6 | 5/15 | α | 320 |
| Comparative Example | | | | | | | | | |
| 1 | a1 | 4100 | 100 | — | — | C7 | 25 | β | 320 |
| 2 | a2 | 8700 | 80 | B2 | 20 | C5 | 25 | β | 320 |

TABLE 2

| | Sensitivity (msec) | Resolution (μm) | Remained thickness ratio (%) | Develop-ability | Pattern form | Heat resistance (°C.) |
|---|---|---|---|---|---|---|
| Example | | | | | | |
| 1 | 300 | 0.38 | >99 | Excellent | Excellent | 150 |
| 2 | 310 | 0.38 | >99 | Excellent | Excellent | 150 |
| 3 | 270 | 0.40 | >99 | Excellent | Excellent | 150 |
| 4 | 260 | 0.40 | >99 | Excellent | Excellent | 150 |
| 5 | 290 | 0.40 | >99 | Excellent | Excellent | 150 |
| 6 | 310 | 0.38 | >99 | Excellent | Excellent | 150 |
| 7 | 280 | 0.40 | >99 | Excellent | Excellent | 150 |
| 8 | 270 | 0.40 | >99 | Excellent | Excellent | 150 |
| 9 | 310 | 0.40 | >99 | Excellent | Excellent | 150 |
| Comparative Example | | | | | | |
| 1 | 370 | 0.42 | 98 | Scumming[1] | Poor | 140 |
| 2 | 390 | 0.42 | >99 | Excellent | Excellent | 145 |

[1] Scumming occurred when a 0.44 μm pattern was formed.

EXAMPLES 10-21

One of the novolak resins (A10) to (A19) synthesized in the above Synthesis Examples, one or none of the following compounds (B) as a dissolution promoter, one or two of the following quinonediazide compounds (C) and one of the following solvents were mixed to prepare a homogeneous solution, and the solution was filtered with a membrane filter having a pore diameter of 0.2 μm to obtain a composition (solution).

Compounds (B)
(B1), (B2), (B3) and (B4); the same as those used in Examples 1 to 9
Quinonediazide Compounds (C)
(C1), (C2), (C3), (C4), (C5), (C6) and (C7); the same as those used in Examples 1 to 9. (C8); condensate from 1 mol of 1,1,1-tris(4-hydroxyphenyl)ethane and 1 mol of 1,2-naphthoquinonediazide-5-sulfonyl chloride
Solvent
(α), (β) and (γ); the same those used in Examples 1 to 9.

Table 3 shows the amounts of the above components incorporated.

TABLE 3

| | Novolak resin (A) | | | Dissolution promotor (B) | | Quinonediazide comound (C) | | Solvent | |
|---|---|---|---|---|---|---|---|---|---|
| | Kind | Mw | Amount (parts by weight) | Kind | Amount (parts by weight) | Kind | Amount (parts by weight) | Kind | Amount (parts by weight) |
| Example | | | | | | | | | |
| 10 | A10 | 7500 | 80 | B1 | 20 | C2 | 30 | α | 320 |
| 11 | A11 | 8100 | 80 | B2 | 20 | C3 | 25 | β | 320 |
| 12 | A12 | 9600 | 85 | B3 | 15 | C4 | 30 | γ | 320 |
| 13 | A13 | 4000 | 100 | — | — | C5 | 25 | β | 320 |
| 14 | A14 | 4700 | 100 | — | — | C6 | 20 | γ | 320 |
| 15 | A16 | 5000 | 100 | — | — | C6/C7 | 12.5/12.5 | α | 320 |
| 16 | A17 | 5700 | 100 | — | — | C2/C3 | 15/10 | β | 320 |
| 17 | A18 | 6200 | 90 | B4 | 10 | C5 | 22.5 | β | 320 |
| 18 | A19 | 9900 | 80 | B3 | 20 | C1/C5 | 5/17.5 | α | 320 |
| 19 | A12 | 9600 | 80 | B3 | 20 | C5 | 27 | γ | 320 |
| 20 | A19 | 9900 | 80 | B3 | 20 | C4 | 30 | γ | 320 |
| 21 | A12 | 9600 | 80 | B3 | 20 | C4 | 30 | γ | 320 |

The above-obtained solution was applied onto a silicon wafer having a silicon oxide film surface with a spinner, and then the resultant coating was prebaked on a hot plate at 90° C. for 2 minutes to form a resist film having a thickness of 1.2 μm. The resist film was exposed to light having a wavelength of 365 nm (i-ray)

through a reticle, and then subjected to post exposure baking (PEB) on the hot plate at 110° C. for 1 minute. The resist film was developed, rinsed and dried. The resultant resist film was evaluated on sensitivity, resolution, remained thickness ratio, developability, heat resistance and pattern form, and the solution was evaluated on storage stability.

Tables 4 and 5 shows the results. In addition, Table 5 also shows the degrees of the change ratios of sensitivity of the resist films of Comparative Examples 1 and 2, and the viscosity change ratios of the solutions in Comparative Examples 1 and 2.

TABLE 4

| Example | Sensitivity (msec) | Resolution (μm) | Remained thickness ratio (%) | Developability | Pattern form | Heat resistance (°C.) |
|---|---|---|---|---|---|---|
| 10 | 340 | 0.38 | >99 | Excellent | Excellent | 150 |
| 11 | 350 | 0.38 | >99 | Excellent | Excellent | 150 |
| 12 | 360 | 0.38 | >99 | Excellent | Excellent | 155 |
| 13 | 400 | 0,40 | >99 | Excellent | Excellent | 150 |
| 14 | 410 | 0.40 | >99 | Excellent | Excellent | 150 |
| 15 | 370 | 0.40 | >99 | Excellent | Excellent | 150 |
| 16 | 350 | 0.40 | >99 | Excellent | Excellent | 150 |
| 17 | 370 | 0.38 | >99 | Excellent | Excellent | 150 |
| 18 | 340 | 0.40 | >99 | Excellent | Excellent | 150 |
| 19 | 260 | 0.38 | >99 | Excellent | Excellent | 155 |
| 20 | 270 | 0.38 | >99 | Excellent | Excellent | 155 |
| 21 | 260 | 0.38 | >99 | Excellent | Excellent | 155 |

TABLE 5

| | Sensitivity change ratio[1] (%) | Viscosity change ratio[2] (%) |
|---|---|---|
| Example 13 | 0.4 | 0.2 |
| Example 11 | 0.5 | 0.3 |
| Comparative Example 1 | 6.9 | 4.4 |
| Comparative Example 2 | 9.8 | 2.9 |

1) Sensitivity change ratio = $\dfrac{\text{Sensitivity just after preparation} - \text{Sensitivity after 3 months}}{\text{Sensitivity just after preparation}} \times 100(\%)$ 2) Viscosity change ratio = $\dfrac{\text{Viscosity just after preparation} - \text{Viscosity after 3 months}}{\text{Viscosity just after preparation}} \times 100(\%)$

What is claimed is:

1. An i-ray sensitive positive resist composition which comprises an alkali-soluble novolak resin obtained by subjecting a phenolic mixture to polycondensation together with an aldehyde, and an i-ray sensitive amount of a 1,2-quinonediazide compound in admixture with said alkali-soluble novolak resin, said phenolic mixture containing 5 to 90 mol % of 2,3-xylenol, 5 to 50 mol % of 3,4-xylenol and 5 to 90 mol % of m-cresol, based on the total molar weight of 2,3-xylenol, 3-4-xylenol and m-cresol, said composition have sensitivity to i-ray.

2. The composition of claim 1, wherein the i-ray sensitive amount of the 1,2-quinonediazide compound is 3 to 100 parts by weight based on 100 parts by weight of the novolak resin.

3. The composition of claim 1, wherein the 1,2-quinonediazide compound is 1,2-quinonediazide-5-sulfonic acid ester of a phenolic compound of the formula (Q1),

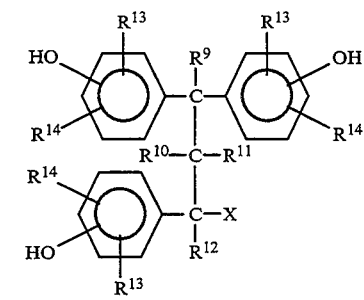

(Q1)

wherein each of $R^1$ to $R^8$ is, independently of others, a hydrogen atom or an alkyl group, and 1,2-quinonediazide-5-sulfonic acid ester of a phenolic compound of the formula (Q2),

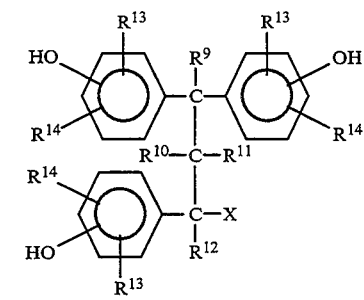

(Q2)

wherein each of $R^9$ to $R^{14}$ is, independently of others, a hydrogen atom or an alkyl group, and X is a hydrogen atom, an alkyl group or an aryl group.

4. The composition of claim 3, wherein the 1,2-quinonediazide-5-sulfonic acid ester of a phenolic compound of the formula (Q1) is 1,2-quinonediazide-5-sulfonic acid ester of a phenolic compound of the formula (Q1)-a,

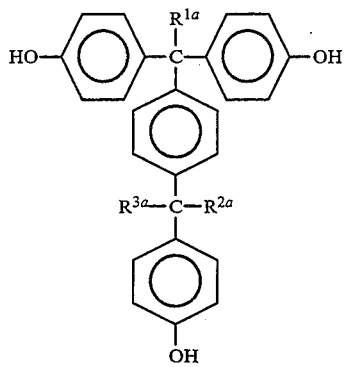

(Q1)-a wherein each of $R^{1a}$, $R^{2a}$ and $R^{3a}$ is, independently of others, a hydrogen atom, a methyl group or an ethyl group.

5. The composition of claim 3, wherein the 1,2-quinonediazide-5-sulfonic acid ester of a phenolic compound of the formula (Q2) is 1,2-quinonediazide-5-sulfonic acid ester of a phenolic compound of the formula (Q2)-a,

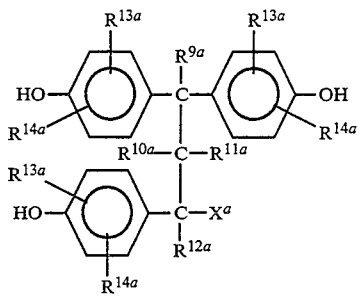

(Q2)-a wherein each of $R^{9a}$, $R^{10a}$, $R^{11a}$ and $R^{12a}$ is, independently of others, a hydrogen atom, a methyl group or an ethyl group, each of $R^{13a}$ and $R^{14A}$ is, independently of other, a methyl group or an ethyl group, and $X^a$ is a hydrogen atom, a methyl group, an ethyl group or a phenyl group.

6. The composition of claim 1, wherein the 1,2-quinonediazide compound is 1,2-quinonediazide-5-sulfonic acid ester of the phenolic compound selected from the group consisting of 1,1-bis(4-hydroxyphenyl)-4-[1-(4-hydroxyphenyl)-1-methylethyl]-1-phenylethane, 1,1,3-tri(4-hydroxy-2,5-dimethylphenyl)propane, 1,1,3-tri(4-hydroxy-2,5-dimethylphenyl)butane and 1,1,3-tri(4-hydroxy-2,5-dimethylphenyl)-3-phenylpropane.

* * * * *